United States Patent
Lin et al.

(10) Patent No.: US 11,784,094 B2
(45) Date of Patent: Oct. 10, 2023

(54) LASER LIFT-OFF METHOD FOR SEPARATING SUBSTRATE AND SEMICONDUCTOR-EPITAXIAL STRUCTURE

(71) Applicant: SKY TECH INC., Hsinchu County (TW)

(72) Inventors: Jing-Cheng Lin, Hsinchu County (TW); Tsung-Hua Hsieh, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 413 days.

(21) Appl. No.: 17/194,100

(22) Filed: Mar. 5, 2021

(65) Prior Publication Data

US 2022/0285218 A1    Sep. 8, 2022

(51) Int. Cl.
  *B32B 43/00* (2006.01)
  *H01L 21/78* (2006.01)
  *B23K 26/50* (2014.01)
  *B23K 26/16* (2006.01)
  *B23K 26/402* (2014.01)
  *B23K 26/08* (2014.01)

(52) U.S. Cl.
  CPC .......... *H01L 21/7813* (2013.01); *B23K 26/08* (2013.01); *B23K 26/16* (2013.01); *B23K 26/402* (2013.01); *B23K 26/50* (2015.10); *B32B 43/006* (2013.01); *Y10T 156/1158* (2015.01); *Y10T 156/1917* (2015.01)

(58) Field of Classification Search
  CPC ............. B32B 43/006; Y10T 156/1158; Y10T 156/1917; H01L 21/7813
  See application file for complete search history.

(56) References Cited

U.S. PATENT DOCUMENTS

| | | | | |
|---|---|---|---|---|
| 2011/0073889 A1* | 3/2011 | Sugizaki | ............... | H01L 33/505 257/E33.061 |
| 2015/0279707 A1* | 10/2015 | Sim | ..................... | H01L 21/6838 156/752 |
| 2015/0349136 A1* | 12/2015 | Koo | ..................... | H01L 27/1218 257/43 |
| 2018/0019169 A1* | 1/2018 | Henley | ............. | H01L 21/02002 |
| 2020/0243708 A1* | 7/2020 | Yanagawa | ........... | H01L 33/0093 |

* cited by examiner

*Primary Examiner* — Philip C Tucker
*Assistant Examiner* — Nickolas R Harm
(74) *Attorney, Agent, or Firm* — Chun-Ming Shih; HDLS IPR SERVICES

(57) ABSTRACT

The present disclosure provides a laser lift-off method for separating substrate and semiconductor-epitaxial structure, which includes: providing at least one semiconductor device, wherein the semiconductor device includes a substrate and at least one semiconductor-epitaxial structure disposed in a stack-up manner; irradiating a laser onto an edge area of the semiconductor device to separate portions of the substrate and the semiconductor-epitaxial structure in the edge area; and pressing against the edge area of the semiconductor device vis a pressing device, then irradiating the laser onto an inner area of the semiconductor device to separate portions of the substrate and the semiconductor-epitaxial structure in the inner area wherein gas is generated during separating the portions of the substrate and the semiconductor-epitaxial structure in the inner area and evacuated from the edge area, to prevent damage of the semiconductor-epitaxial structure during the separating process.

20 Claims, 6 Drawing Sheets

LASER LIFT-OFF METHOD FOR SEPARATING SUBSTRATE AND SEMICONDUCTOR-EPITAXIAL STRUCTURE

TECHNICAL FIELD

The present disclosure relates to a laser lift-off method for separating substrate and semiconductor-epitaxial structure, which is to evacuate gas from an edge area wherein the gas is produced during separation of the substrate and the semiconductor-epitaxial structure, such that to prevent damage to the semiconductor-epitaxial structure during the separation process.

BACKGROUND

Sapphire substrate is a commonly employed type of substrate for semiconductor-epitaxial structures. The sapphire substrate has several advantages, such as fine chemical stability, zero absorbance of visible-light, economic price and technical maturity. However, the sapphire substrate also has few disadvantages, such as high electric resistance and low thermal conductivity, those can become drawbacks to a performance of the semiconductor-epitaxial structure disposed on the sapphire substrate.

To overcome the abovementioned drawbacks, a modern technology so called laser lift-off is created, which is to replace the sapphire substrate connected to the semiconductor-epitaxial structure, by other substrate with better thermal and electrical conductivity, such as metallic substrate or silicone substrate, to improve the performance of the semiconductor-epitaxial structure. To be specific, the technology is first to connect the semiconductor-epitaxial structure to a sapphire substrate, then to separate the semiconductor-epitaxial structure and the sapphire substrate by laser, thereby to replace the sapphire substrate by other substrate.

The laser is capable of separating the semiconductor-epitaxial structure and the sapphire substrate, however during the separation process, stress is often formed between portions of the semiconductor-epitaxial structure and the sapphire substrate those are yet to separate, which can cause bending deformation of the semiconductor-epitaxial structure and/or the sapphire substrate, for example, overbending of separated portions can forcibly tear off the yet-to-separate portions and damage the semiconductor-epitaxial structure.

SUMMARY

As described in the background, in the process of separating the substrate and the semiconductor-epitaxial structure by the laser, the stress causing the bending deformation comes from some gas which is produced as the laser irradiates onto and burns the semiconductor-epitaxial structure and/or the substrate, such that the gas may sneak into those yet-to-separate portions, then damage the semiconductor-epitaxial structure. Therefore, the present disclosure provides a new laser lift-off method for separating the substrate and the semiconductor-epitaxial structure, which is first to proceed a separation process from an edge area of a semiconductor device assembled by the substrate and the semiconductor-epitaxial structure, then next to proceed the separation process in an inner area of the semiconductor device, wherein the gas produced during the separation process is evacuated from the edge area, thereby to prevent damage to the semiconductor-epitaxial structure.

An object of the present disclosure is to provide a laser lift-off method, which is mainly used for separating a substrate and at least one semiconductor-epitaxial structure. In a separation process, first is to irradiate a laser onto an edge area of a semiconductor device assembled by the substrate and the semiconductor-epitaxial structure, such that to separate the semiconductor-epitaxial structure and a portion the substrate in the edge area of the semiconductor device, and to create an evacuating gap therebetween.

Thereafter to irradiate the laser onto an inner area of the semiconductor device, to separate the semiconductor-epitaxial structure and the substrate in the inner area, wherein the inner area is radially-inner than the edge area. In the process of separating the semiconductor-epitaxial structure and the substrate, a side of the semiconductor-epitaxial structure connected to the substrate absorbs energy from the laser and starts thermal decomposition. The gas produced from the thermal decomposition is transferred out of the semiconductor device by the edge area, thereby effective to prevent the gas from sneaking in between the yet-to-separate portions of the semiconductor-epitaxial structure and the substrate and causing stress cracking of those portions.

An object of the present disclosure is to provide a laser lift-off method for separating the substrate and the semiconductor-epitaxial structure, which mainly is to irradiate the laser onto the edge area of the semiconductor device, to separate the semiconductor-epitaxial structure and the substrate in the edge area. Next to partially press against the edge area of the semiconductor device via a pressing device, and to irradiate the laser onto the inner area of the semiconductor device, thereby to separate the semiconductor-epitaxial structure and the substrate in the inner area. Next to press against the separated portions of the semiconductor-epitaxial structure and/or the substrate via the pressing device, thereby to prevent the separated portions of the semiconductor-epitaxial structure and/or the substrate from overbending, bulging up and tearing apart the yet-to-separate portions of the semiconductor-epitaxial structure then to cause damage to the semiconductor-epitaxial structure.

An object of the present disclosure is to provide a laser lift-off method for separating the substrate and the semiconductor-epitaxial structure, which mainly is to irradiate the laser onto the edge area nearest to a lateral side of the semiconductor device, thereby to separate the portions of the semiconductor-epitaxial structure and the substrate in the edge area. Next to move the laser radially-inward to process the yet-to-separate portions adjacent to the edge area, and separate those portions of the semiconductor-epitaxial structure and the substrate there.

When a width of the separated portions in the edge area increases and reaches or exceeds a nominated width, such as 1.5 millimeter (mm), then to press against or fasten the separated portions by the pressing device, thereafter to process the inner area of the semiconductor device with the laser, until the semiconductor-epitaxial structure and the substrate are completely separate. By virtue of the laser lift-off method for separating the substrate and the semiconductor-epitaxial structure according to the present disclosure, which can facilitate evacuating the gas produced in the separation process, furthermore to prevent the separated portions of the substrate and the semiconductor-epitaxial structure from overbending, bulging up and forcibly tearing apart the yet-to-separate portions and then damaging the semiconductor-epitaxial structure.

To achieve the abovementioned objects, the present disclosure provides a laser lift-off method for separating substrate and semiconductor-epitaxial structure, which includes: providing at least one semiconductor device, wherein the semiconductor device includes a substrate and at least one semiconductor-epitaxial structure connected to the substrate; irradiating a laser onto an edge area of the semiconductor device, wherein light of the laser is projected on a side of the semiconductor-epitaxial structure connected to the substrate and separates of the substrate and the semiconductor-epitaxial structure in the edge area; pressing against the edge area of the semiconductor device via a pressing device; and irradiating the laser onto an inner area of the semiconductor device, wherein, the light of the laser is projected on the side of the semiconductor-epitaxial structure connected to the substrate such that to separate the substrate and the semiconductor-epitaxial structure in the inner area, wherein the edge area is outer than and surrounds the inner area.

The present disclosure also provides another laser lift-off method for separating substrate and semiconductor-epitaxial structure, which includes: providing at least one semiconductor device, wherein the semiconductor device includes a substrate and at least one semiconductor-epitaxial structure connected to the substrate; irradiating a laser onto the semiconductor device and move the laser along a lateral side of the semiconductor device, to separate the substrate and the semiconductor-epitaxial structure in the lateral side, and to form a first separate zone in the lateral side; moving the laser radially-inward from the first separate zone; forming at least one second separate zone which is inner and adjacent to the first separate zone, as the laser moves inward from the first separate zone; pressing against the first and second separate zones of the semiconductor device via a pressing device; and irradiating the laser onto an inner area of the semiconductor device, to separate the substrate and the semiconductor-epitaxial structure in the inner area, wherein the second separate zone surrounds the inner area.

The laser lift-off method for separating substrate and semiconductor-epitaxial structure, further includes: placing the semiconductor device on a suction platform, to create a negative pressure for sucking and fastening the semiconductor device thereby; and irradiating the laser onto the edge area of the semiconductor device and entering a light of the laser from a side of the substrate, such that the laser irradiates onto the semiconductor-epitaxial structure from the side of the substrate, then the semiconductor-epitaxial structure absorbs a heat energy from the laser and starts thermal decomposition.

The abovementioned laser lift-off method, wherein a width of the edge area or a sum width of the first separate zone and the second separate zone is equal to or larger than 1.5 mm.

The abovementioned laser lift-off method, wherein the pressing device includes a plurality of pressing units for pressing against the edge area, the first separate zone and the second separate zone of the semiconductor device, also each adjacent two of pressing units have a gap therebetween.

The abovementioned laser lift-off method, wherein the semiconductor-epitaxial structure is a gallium-nitride-compound structure and a gallium-nitride structure.

The abovementioned laser lift-off method, wherein a light spot of the laser projected on the first separate zone is larger than that on the second separate zone.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
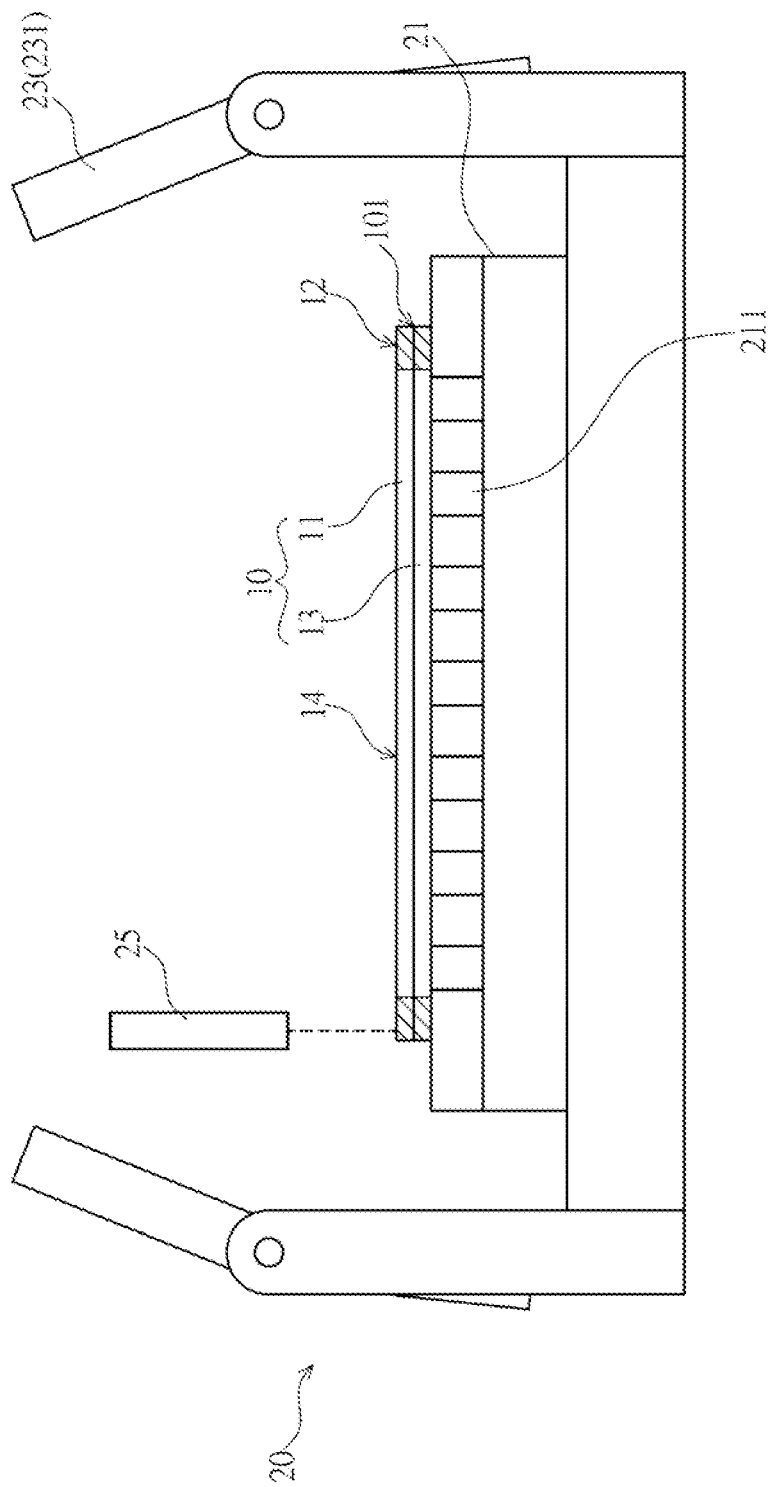
FIG. 1 is a schematic sectional view of proceeding a separation process in an edge area of a semiconductor device, by a laser lift-off method for separating substrate and semiconductor-epitaxial structure according to one embodiment of the present disclosure.
Figure 2:
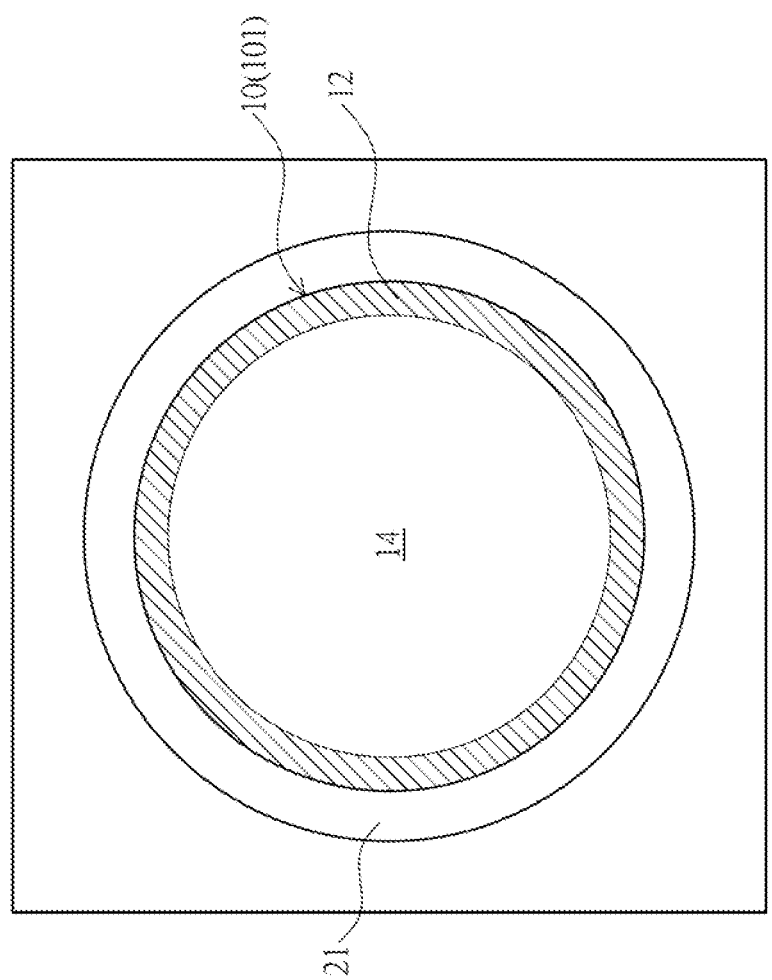
FIG. 2 is a schematic top view of proceeding separation in the edge area of the semiconductor device, by the laser lift-off method for separating substrate and semiconductor-epitaxial structure according to one embodiment of the present disclosure.

Referring to FIG. 1~FIG. 6, which are schematic views of proceeding a separation process to a semiconductor device 10, by a laser lift-off method for separating substrate and semiconductor-epitaxial structure according to one embodiment of the present disclosure. As shown, the laser lift-off method is first to provide at least one semiconductor device 10. The semiconductor device 10 includes a substrate 11 and at least one semiconductor-epitaxial structure 13. Herein, the semiconductor-epitaxial structure 13 and the substrate 11 are disposed in a stack-up manner.

The substrate 11 according the present disclosure, which is a substrate suitable for growing the semiconductor-epitaxial structure 13 thereon. In one embodiment of the disclosure, the substrate 11 may be a sapphire substrate, silicon carbide substrate or silicon substrate. The semiconductor-epitaxial structure 13 is a III-V compound semiconductor, such as a gallium-nitride-compound epitaxial structure or a Gallium-nitride epitaxial structure. The semiconductor-epitaxial structure 13 can grow on the substrate 11 by different epitaxial growth process, such as chemical-vapor deposition (CVD), molecular beam epitaxy (MBE), to form different types of electronic device on the substrate 11. The electronic devices on the substrate 11 may be such as transistors, diodes, light-emitting diodes or fifth-generation (5G) electronic devices, etc.

Next to place the semiconductor device 10 on a carrier device 20. Herein, The carrier device 20 includes a suction platform 21 and a pressing device 23. The semiconductor device 10 is placed on the suction platform 21 of the carrier device 20, wherein the suction platform 21 includes a plurality of suction holes 211 for creating a negative pressure for fastening the semiconductor device 10. In practical use, the semiconductor-epitaxial structure 13 of the semiconductor device 10 is placed on the suction platform 21 and sucked, fastened thereon by the negative pressure from the suction holes 211.

In one embodiment of the disclosure, another side of the semiconductor-epitaxial structure 13 (opposite to the substrate 11) may be connected to an alternative substrate (not shown), such as to connect the semiconductor-epitaxial structure 13 and the alternative substrate via a wafer-bonding process. The alternative substrate may be commonly made of a material with thermal conductivity and electrical conductivity, such as metallic substrate or silicon substrate, which can facilitate a performance of the semiconductor-epitaxial structure 13. Thereafter to place the alternative substrate on the suction platform 21, then suck and fasten the alternative substrate via the negative pressure from the suction holes 211 of the suction platform 21, thereby to fasten the semiconductor device 10 on the suction platform 21, so to be ready for the later process of separating the substrate 11 and the semiconductor-epitaxial structure 13.

Next to perform a separation process on the semiconductor device 10, which is to irradiate a laser 25 onto and burn an edge area 12 of the semiconductor device 10, wherein the edge area 12 is an enclosed area nearest to a lateral side 101 (the outmost portion) of the semiconductor device 10 as shown in FIG. 1. When the substrate 11 and the semiconductor-epitaxial structure 13 are completely overlapped, the substrate 11 and the semiconductor-epitaxial structure 13 have proximately identical shapes and area sizes, such that the edge area 12 is defined as an enclosed area nearest to the lateral side 101 (the outmost portions) of both of the substrate 11 and the semiconductor-epitaxial structure 13. However, when the substrate 11 has an area size larger than that of the semiconductor-epitaxial structure 13, then the edge area 12 is then defined as an enclosed area nearest to lateral side of the semiconductor-epitaxial structure 13.

In one embodiment of the disclosure, the laser 25 enters and insert into the semiconductor device 10 from side of the substrate 11. Light of the laser 25 is projected or focused on a side of the semiconductor-epitaxial structure 13 connected to the substrate 11, thereby a portion of the semiconductor-epitaxial structure 13 in the edge area 12 absorbs the heat energy from the laser 25 and starts thermal decomposition, such that a portion of the substrate 11 and the portion of the semiconductor-epitaxial structure 13 in the edge area 12 are separate. In this way, the separation process continues until the entire portion of the substrate 11 and the entire portion of the semiconductor-epitaxial structure 13 in the edge area 12 are completely separate. Specifically, the edge area 12 is the outermost area of the semiconductor device 10 or the outermost area of the semiconductor-epitaxial structure 13, therefore a gas produced from the thermal decomposition in the side of the semiconductor-epitaxial structure 13 connected to the substrate 11, which can be evacuated from the lateral side 101 of the semiconductor device 10 or the semiconductor-epitaxial structure 13.

In practical use, a wavelength or power of the laser 25 can be adjusted, according to material(s) or thickness of the semiconductor-epitaxial structure 13 and/or the substrate 11. For example, when the semiconductor-epitaxial structure 13 is made of gallium nitride and the substrate 11 is made of sapphire, the laser 25 may be a KrF excimer laser with a wavelength of 248 nanometer (nm). As the light of the laser 25 be projected or focused on a side of the gallium-nitride semiconductor-epitaxial structure 13 connected to the sapphire substrate 11, the gallium nitride starts thermal decomposition and breaks down into nitrogen gas and gallium metal, and then the nitrogen gas can be evacuated and out of the edge area 12 and/or the lateral side 101 of the semiconductor device 10. However, the material and type of laser described herein is merely one embodiment of the present disclosure, which do not limit claim scope of the present disclosure.

Figure 3:
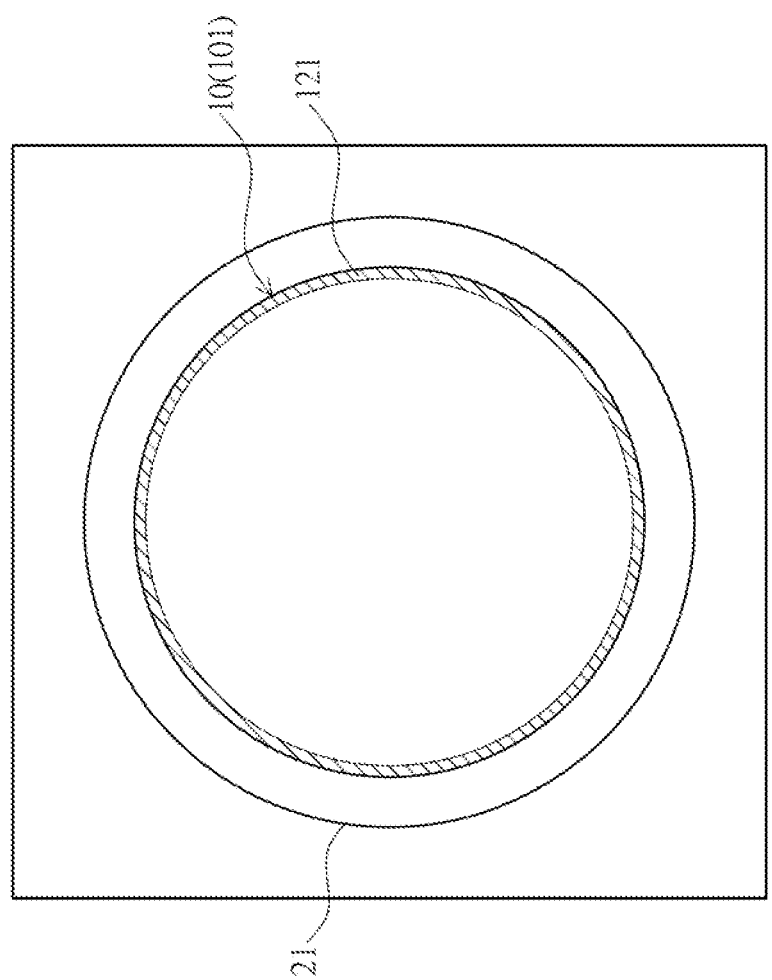
FIG. 3 and FIG. 4 are schematic top views of proceeding a separation process in the edge area of the semiconductor device, by the laser lift-off method for separating substrate and semiconductor-epitaxial structure according to another embodiment of the present disclosure.
Figure 4:
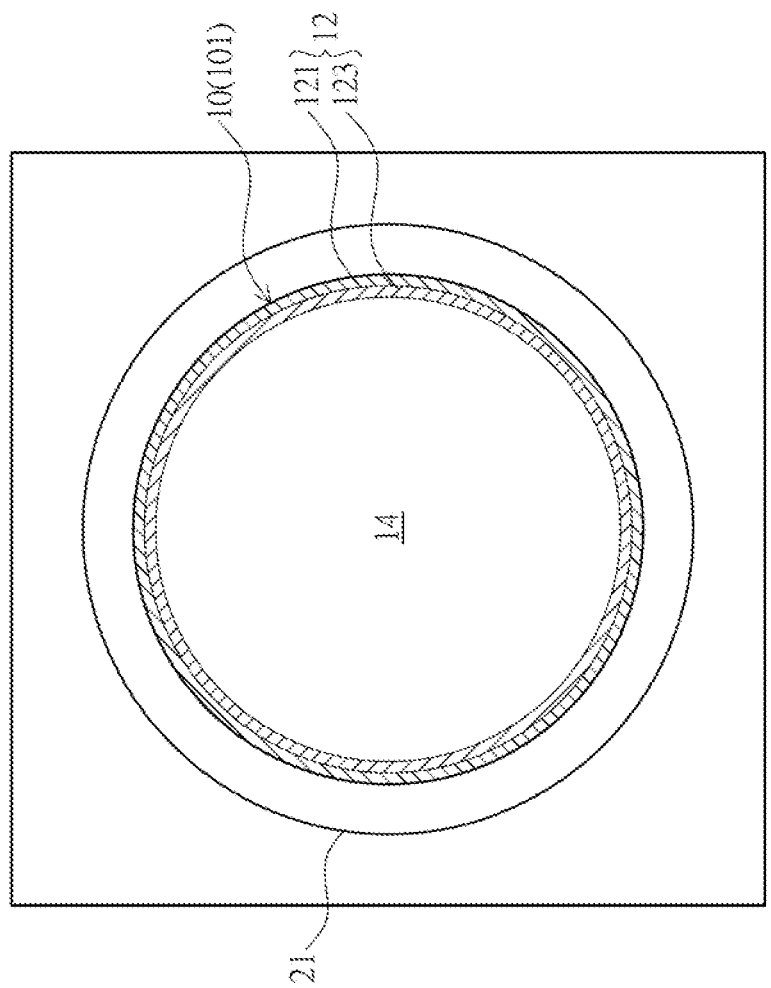

In one embodiment of the disclosure, the edge area 12 may be defined to include a plurality enclosed circles with different radiuses, as routes for the laser 25. As shown in FIG. 3, the method is first to irradiate the laser 25 onto the edge area 12 of the semiconductor device 10 nearest to the lateral side 101 thereof, then to move the laser 25 along the routing circle in the lateral side 101, and separate a portion of the substrate 11 and a portion of the semiconductor-epitaxial structure 13 nearby the lateral side 101 to form a first separate zone 121.

Thereafter to move the laser 25 radially inward and along an inner periphery (the inner routing circle) of the first separate zone 121, to form a second separate zone 123 on the semiconductor device 10. The second separate zone 123 has a periphery and/or a radius smaller than that of the first separate zone 121. The second separate zone 123 is adjacent to and inner than the first separate zone 121. After the first separate zone 121 is formed on the semiconductor device 10, the laser 25 may be further moved to the radially-inner side of the first separate zone 121, the semiconductor device 10 and/or semiconductor-epitaxial structure 13. The first separate zone 121 and the second separate zone 123 may be annular or circular, for example. The second separate zone 123 has an outer radius smaller than that of the first separate zone 121, wherein the outer radius of the second separate zone 123 is substantially equal to an inner radius of the first separate zone 121, such that the first separate zone 121 and the second separate zone 123 are continuous and spatially connected to each other.

In practical use of the method, the second separate zone 123 may be defined as plural with different peripheries and/or radiuses, and the second separate zones 123 are formed radially inward from the first separate zone 121 in sequence. The first separate zone 121 and the second separate zones 123 may be circular and spatially connected, with the radius of each of the second separate zones 123 all smaller than that of the first separate zone 121.

As the laser 25 continues to irradiate onto, process and make thermal decomposition in the edge area 12 to form a processed zone, a width of the processed zone increases, then until the width of the processed zone approaches a threshold value, the laser 25 may be temporarily stopped from processing the semiconductor device 10. For example, the threshold value is set equal to or greater than 1.5 millimeter (mm), and more preferable to be equal to or greater than 3 mm. To be more specific, the processed zone in the edge area 12 may include the first separate zone 121 and at least one of the second separate zone 123, such that the width of the processed zone is a summed value of a width of the first separate zone 121 and a width of the second separate zone(s) 123, which is equal to or greater than 1.5 mm, and preferably to be equal to or greater than 3 mm.

Also in one embodiment of the disclosure, the laser 25 may process with different light spot sizes when forming the first separate zone 121 and forming the second separate zone(s) 123. As long as there is no effect on yield, quality of production, the laser 25 may process with a larger light spot size when forming the first separate zone 121, and process with a smaller light spot size when forming the second separate zone(s) 123, to improve an efficiency of separating the semiconductor-epitaxial structure 13 and the substrate 11.

Figure 5:
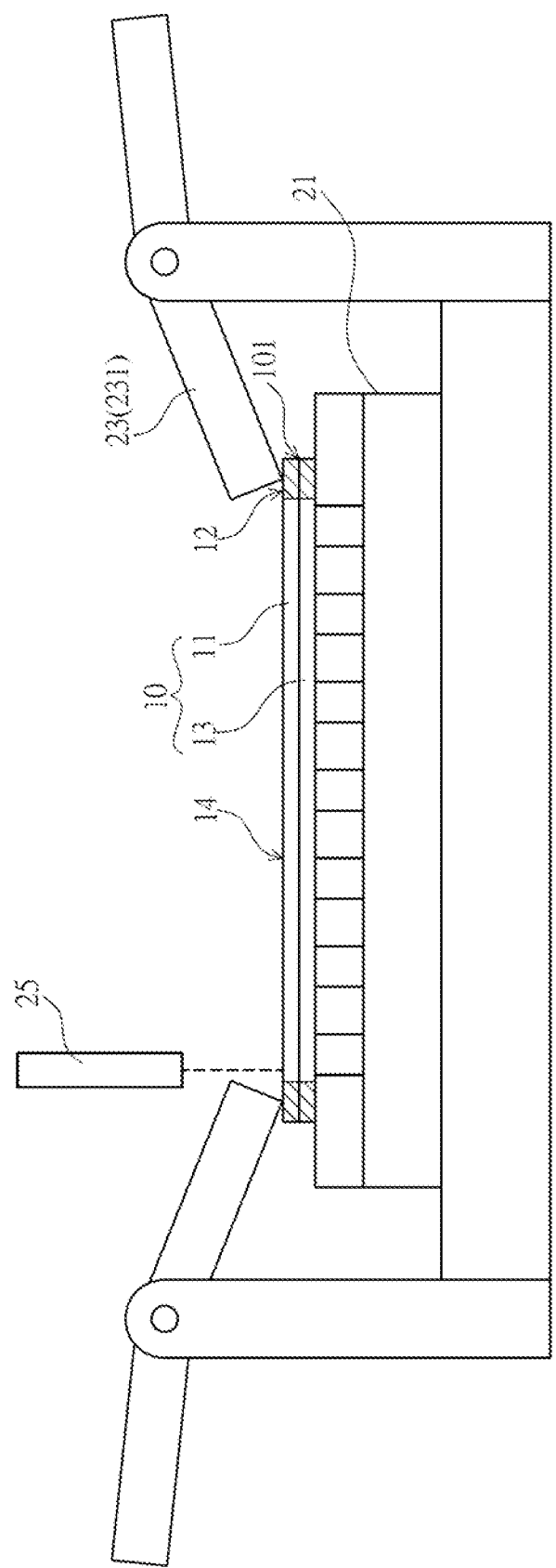
FIG. 5 is a schematic sectional view of proceeding separation in an inner area of the semiconductor device, by a laser lift-off method according to one embodiment of the present disclosure.
Figure 6:
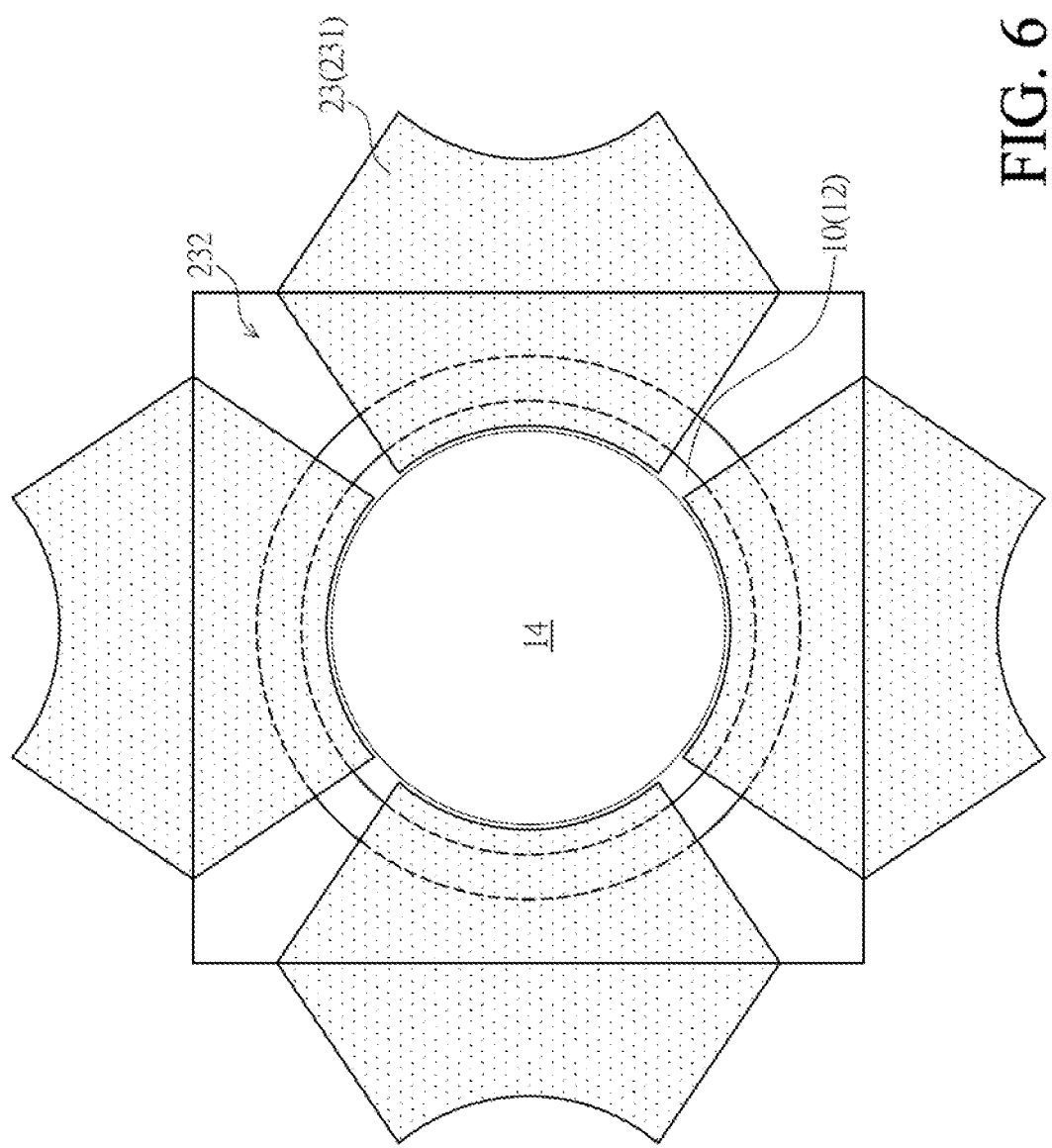
FIG. 6 is a schematic top view of separating the inner area of the semiconductor device, by a laser lift-off method according to one embodiment of the present disclosure.

As shown in FIG. 5 and FIG. 6, after the laser 25 separated and formed the first separate zone 121 and/or the second separate zone 123 in the edge area 12 of the semiconductor device 10, as the width of the processed zone reaches the threshold value and the laser 25 may be temporarily stopped from processing the semiconductor device 10, a pressing device 23 may be applied to press against the edge area 12 of the semiconductor device 10 where the first separate zone 121 and/or the second separate zones 123 are formed. Meanwhile, the semiconductor device 10 is fastened on the suction platform 21 of the carrier device 20. Thereafter to irradiate the laser 25 onto the inner area 14 of the semiconductor device 10, wherein the inner area 14 is defined further inner than and surrounded by the edge area 12 and/or the second separate zone 123.

As the laser 25 be projected on the side of the semiconductor-epitaxial structure 13 connected to the substrate 11, a portion of the semiconductor-epitaxial structure 13 in the inner area 14 absorbs the energy from the laser 25 and starts thermal decomposition, thereby to separate the portion of the semiconductor-epitaxial structure 13 and a portion of the substrate 11 in the inner area 14. As the semiconductor-epitaxial structure 13 and the substrate 11 in the edge area 12 already be processed and separated by the laser 25, a gas produced from the thermal decomposition of the semiconductor-epitaxial structure 13 in the inner area 14 can pass between the separated portions of semiconductor-epitaxial structure 13 and the substrate 11, and be evacuated from the edge area 12. Thereby, the gas is prevented from sneaking into the adjacent yet-to-separate portions in the inner area 14 then causing stress cracking of the yet-to-separate portions of the substrate 11 and the semiconductor-epitaxial structure 13.

A scan pattern or movement of the laser 25 for processing the inner area 14 of the semiconductor device 10, which includes but is not limited to be spiral, coaxially circular or chess pattern. The laser 25 is preferable to irradiate onto and process the inner area 14 from a start point adjacent to the separated edge area 12 and/or the second separate zone 123, such that to facilitate evacuating the gas produced from thermal decomposition out of the edge area 12, the second separate zone 123 and/or the first separate zone 121 and then flushing out of the semiconductor device 10.

When the laser 25 is irradiating onto and processing the inner area 14 of the semiconductor device 10, the pressing device 23 presses against the edge area 12, the second separate zone 123 and/or the first separate zone 121 of the semiconductor device 10, to prevent the separated portions of the substrate 11 and/or the semiconductor-epitaxial structure 13 in the edge area 12, the second separate zone 123 and/or the first separate zone 121 from bulging up and tearing the yet-to-separate portions of the substrate 11 and/or the semiconductor-epitaxial structure 13, then to further prevent damage to the portions of the semiconductor-epitaxial structure 13 in the inner area 14.

In one embodiment of the disclosure, the pressing device 23 includes a plurality of pressing units 231 for pressing against the edge area 12, the second separate zone 123 and/or the first separate zone 121 of the semiconductor device 10. The pressing units are spaced-apart from each other, and each adjacent two of pressing units 231 have a gap 232 therebetween. For example, each of the pressing units 231 can swing related to the suction platform 21, and press against the semiconductor device 10 fastened on the suction platform 21. However, the pressing device 23 including a plurality of pressing units 231 with gaps 232 therebetween, which is merely one embodiment of the present disclosure and does not limit the claim scope of the present disclosure.

Areas of the semiconductor device 10 exposed from the gaps 232 are not pressed by the pressing units 231, therefore the portions of the semiconductor-epitaxial structure 13 in the exposed areas are still separate from the substrate 11. Thereby, the gas produced from the thermal decomposition of the semiconductor-epitaxial structure 13 in the inner area 14, which can pass between the separated portions of the semiconductor-epitaxial structure 13 and the substrate 11 in those areas exposed by the gaps 232, and then be evacuated. Such that, the separation process continues to proceed, until the entire portion of the substrate 11 and the entire portion of the semiconductor-epitaxial structure 13 in the inner area 14 are completely separate, thereby to remove the substrate 11 from the semiconductor-epitaxial structure 13.

In another embodiment of the present disclosure, the pressing device 23 may have an annular appearance, and be configured to move relative to the suction platform 21 in an up-down direction, and to press against the semiconductor device 10 on the suction platform 21. The pressing device 23 is configured to presses against the semiconductor device 10 on the suction platform 21 with a suitable force, therefore the separated portions of the substrate 11 and the semiconductor-epitaxial structure 13 in the edge area 12, second separate zone 123 and/or the first separate zone 121 still remain a small space therebetween. Although the annular pressing device 23 has no gap 232, the gas produced from the separated portions in the inner area 14 still can be evacuated, from the space between the separated portions of the substrate 11 and the semiconductor-epitaxial structure 13 in the edge area 12, the second separate zone 123 and/or the first separate zone 121.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

We claim:

1. A laser lift-off method for separating substrate and semiconductor-epitaxial structure, comprising:
   providing at least one semiconductor device, wherein the at least one semiconductor device comprises a substrate and at least one semiconductor-epitaxial structure, and the at least one semiconductor-epitaxial structure is connected to the substrate;
   irradiating a laser onto an edge area of the at least one semiconductor device, wherein a light of the laser is projected on a side of the at least one semiconductor-epitaxial structure that is connected to the substrate to separate the substrate and the at least one semiconductor-epitaxial structure in the edge area;
   pressing the edge area of the at least one semiconductor device via a pressing device; and
   irradiating the laser onto an inner area of the at least one semiconductor device, the light of the laser is projected on the side of the at least one semiconductor-epitaxial structure that is connected to the substrate to separate the substrate and the at least one semiconductor-epitaxial structure in the inner area.

2. The laser lift-off method according to claim 1, wherein the light of the laser is projected on the side of the at least one semiconductor-epitaxial structure that is connected to the substrate, to separate the substrate and the at least one semiconductor-epitaxial structure in the edge area, thereby the at least one semiconductor-epitaxial structure absorbs an energy from the laser and starts thermal decomposition then to produce gas, and the gas is evacuated from a lateral side of the at least one semiconductor device.

3. The laser lift-off method according to claim 1, further comprising:

placing the at least one semiconductor device on a suction platform that creates a negative pressure for sucking and fastening the at least one semiconductor device; and operating the light of the laser to enter the at least one semiconductor device from the substrate to irradiate onto the edge area of the at least one semiconductor device and to be projected on the side of the at least one semiconductor-epitaxial structure that is connected to the substrate, thereby to allow the at least one semiconductor-epitaxial structure absorb an energy from the laser and start thermal decomposition.

4. The laser lift-off method according to claim 3, wherein the suction platform comprises a plurality of suction holes for creating a negative pressure for fastening the at least one semiconductor device.

5. The laser lift-off method according to claim 3, wherein the pressing device is formed in an annular shape, and disposed to move related to the suction platform in an up-down direction for pressing the at least one semiconductor device on the suction platform.

6. The laser lift-off method according to claim 1, further comprising:
operating the laser to irradiate onto and process the edge area of the at least one semiconductor device to form a processed zone, until a width of the processed zone exceeds a threshold value; and
temporarily stopping the laser from processing the at least one semiconductor device, and using the pressing device to press against the edge area of the at least one semiconductor device, thereafter to irradiate the laser onto and process the inner area of the at least one semiconductor device.

7. The laser lift-off method according to claim 6, wherein the threshold value is equal to or greater than 1.5 mm.

8. The laser lift-off method according to claim 1, wherein the pressing device comprises a plurality of pressing units for pressing against the edge area of the at least one semiconductor device, and each adjacent two of the pressing units have a gap therebetween.

9. The laser lift-off method according to claim 1, wherein the at least one semiconductor-epitaxial structure is a gallium-nitride-compound epitaxial structure or a gallium-nitride epitaxial structure.

10. The laser lift-off method according to claim 1, comprising a step of connecting the at least one semiconductor-epitaxial structure of the at least one semiconductor device to an alternative substrate, before irradiating the laser onto the at least one semiconductor device.

11. A laser lift-off method for separating substrate and semiconductor-epitaxial structure, comprising:
providing at least one semiconductor device, wherein the at least one semiconductor device comprises a substrate and at least one semiconductor-epitaxial structure, and the at least one semiconductor-epitaxial structure is connected to the substrate;
irradiating a laser onto and processing the at least one semiconductor device and move the laser along a lateral side of the at least one semiconductor device, to separate the substrate and the at least one semiconductor-epitaxial structure in the lateral side and to form a first separate zone in the lateral side of the at least one semiconductor device;
moving the laser toward a radially-inner side of the first separate zone;
moving the laser along an inner periphery of the first separate zone to form at least one second separate zone, wherein the at least one second separate zone is adjacent to the first separate zone and in the radially-inner side of the first separate zone;
pressing against the first separate zone and the at least one second separate zone of the at least one semiconductor device via a pressing device; and
irradiating the laser onto and processing an inner area of the at least one semiconductor device, a light of the laser is projected on a side of the at least one semiconductor-epitaxial structure that is connected to the substrate to separate the substrate and the at least one semiconductor-epitaxial structure in the inner area, wherein the at least one second separate zone surrounds the inner area.

12. The laser lift-off method according to claim 11, comprising of a step of placing the at least one semiconductor device on a suction platform that creates a negative pressure for sucking and fastening the at least one semiconductor device.

13. The laser lift-off method according to claim 12, wherein the suction platform comprises a plurality of suction holes for creating a negative pressure to fasten the at least one semiconductor device.

14. The laser lift-off method according to claim 12, wherein the pressing device is formed in an annular shape, and disposed to move related to the suction platform in an up-down direction for pressing the at least one semiconductor device on the suction platform.

15. The laser lift-off method according to claim 11, comprising a step of operating the light of the laser to enter the at least one semiconductor device from the substrate and projecting the light of the laser on the side of the at least one semiconductor-epitaxial structure that is connected to the substrate, when processing and forming the first separate zone and the at least one second separate zone of the at least one semiconductor device, thereby to allow the at least one semiconductor-epitaxial structure absorb an energy from the laser and start thermal decomposition then to produce gas, and then the gas is evacuated from the lateral side of the at least one semiconductor device.

16. The laser lift-off method according to claim 11, wherein the pressing device comprises a plurality of pressing units for pressing against the first separate zone and the at least one second separate zone of the at least one semiconductor device, and each adjacent two of the pressing units have a space therebetween.

17. The laser lift-off method according to claim 11, comprising:
operating the laser to process and form the first separate zone and the at least one second separate zone of the at least one semiconductor device, until a summed value of a width of the first separate zone and a width of the at least one second separate zone exceeds a threshold value; and
temporarily stopping the laser from processing the at least one semiconductor device, and using the pressing device to press against the first separate zone and the at least one second separate zone of the at least one semiconductor device, thereafter to continue processing the at least one semiconductor device with the laser.

18. The laser lift-off method according to claim 17, wherein the threshold value is equal to or greater than 1.5 mm.

19. The laser lift-off method according to claim 11, wherein a light spot size of the laser projected on the first separate zone is larger than that on the at least one second separate zone.

20. The laser lift-off method according to claim 11, comprising a step of connecting the at least one semiconductor-epitaxial structure of the at least one semiconductor device to an alternative substrate, before irradiating the laser onto and processing the at least one semiconductor device.

* * * * *